United States Patent [19]
Linliu

[11] Patent Number: 5,902,133
[45] Date of Patent: May 11, 1999

[54] METHOD OF FORMING A NARROW POLYSILICON GATE WITH I-LINE LITHOGRAPHY

[75] Inventor: Kung Linliu, Taipei, Taiwan

[73] Assignee: Vanguard International Semiconductor Corporation, Hsin-Chu, Taiwan

[21] Appl. No.: 08/910,268

[22] Filed: Aug. 13, 1997

[51] Int. Cl.$^6$ ................................................. H01L 21/302
[52] U.S. Cl. ..................... 438/717; 438/694; 438/736; 438/942; 438/947
[58] Field of Search .................................... 430/312, 313, 430/949; 438/8, 257, 263, 264, 377, 571, 694, 695, 717, 725, 736, 942, 947, 975

[56] References Cited

U.S. PATENT DOCUMENTS

| 4,414,057 | 11/1983 | Bourassa et al. | 156/643 |
| 5,013,398 | 5/1991 | Long et al. | 156/643 |
| 5,597,764 | 1/1997 | Koh et al. | 437/195 |

*Primary Examiner*—Charles Bowers
*Assistant Examiner*—Jack Chen
*Attorney, Agent, or Firm*—George O. Saile; Stephen B. Ackerman; Rosemary L.S. Pike

[57] ABSTRACT

A new method for forming a feature having a feature size of one half the resolution of the photolithography process by adjusting the etching conditions is achieved. A capping oxide layer is deposited overlying the feature layer. A first layer of photoresist is patterned using a photolithography process to provide a first photomask having a first feature size. The oxide layer is etched vertically through no more than half of its thickness and the photomask and oxide layer are etched horizontally to provide a first oxide mask having a second feature size one half the width of the first feature size. The first photomask is removed. A second photoresist layer is patterned to provide a second photomask for forming the second feature wherein the second photomask has a first feature size and is shifted horizontally by twice the desired feature size from the first photomask. The oxide layer is etched vertically through no more than half of its thickness and the photomask and oxide layer are etched horizontally to provide a second oxide mask having a second feature size one half the width of the first feature size. All of the capping oxide layer is removed except for the first and second oxide masks. The second photomask is removed. The feature layer is etched through where it is not covered by the first and second oxide masks to form the first and second features having the second line width of one half the resolution of the photolithography process in the manufacture of an integrated circuit device.

17 Claims, 5 Drawing Sheets

METHOD OF FORMING A NARROW POLYSILICON GATE WITH I-LINE LITHOGRAPHY

BACKGROUND OF THE INVENTION (1) Field of the Invention

The present invention relates to the fabrication of integrated circuit devices, and more particularly, to a method of forming a narrow polysilicon gate or other small feature size structures using i-line photolithography in the fabrication of integrated circuits.

(2) Description of the Prior Art

In the fabrication of integrated circuits, photolithography and etching are used to form structures such as polysilicon gates, word lines, bit lines, local oxidation of silicon (LOCOS), shallow trench isolation (STI), and the like. A photoresist material is coated over the layer or layers to be etched. The photoresist material is exposed to actinic light through a mask, then developed to form the photoresist mask for etching the underlying layer or layers. Small feature sizes, on the order of 0.1 to 0.35 microns, are not resolved easily by i-line photolithography.

U.S. Pat. No. 5,597,764 To Koh et al teaches a method of etching contact openings smaller than the openings in a photoresist mask by partially etching into the underlying layer, then depositing an oxide layer within the partially etched openings to decrease the size of the openings. A second etch extends the smaller openings through to the underlying layer to be contacted. U.S. Pat. No. 5,013,398 to Long et al teaches an anisotropic etch method for an oxide/polysilicon structure. U.S. Pat. No. 4,414,057 to Bourassa et al teaches an anisotropic etch method for silicide/polysilicon.

SUMMARY OF THE INVENTION

Accordingly, it is a primary object of the invention to provide an effective and very manufacturable process for forming structures having small line width feature sizes in the fabrication of integrated circuits.

It is a further object of the invention to form structures having feature sizes on the order of between about 0.18 to 0.35 microns.

A still further object of the invention is to form by i-line photolithography and etching structures having feature sizes on the order of between about 0.18 to 0.35 microns.

Yet another object is to form structures having feature sizes of one half the resolution of the photolithography process.

Yet another object is to form structures having feature sizes of one half the resolution of the photolithography process by adjusting the etching conditions.

Yet another object of the invention is to form a narrow polysilicon gate having a line width of one half the resolution of the photolithography process.

In accordance with the objects of the invention, a new method for forming a feature, such as a gate electrode, having a feature size, or a line width, of one half the resolution of the photolithography process by adjusting the etching conditions is achieved. A gate silicon oxide layer is provided on the surface of a semiconductor substrate. A gate electrode layer is deposited overlying the gate silicon oxide layer. A capping oxide layer is deposited overlying the gate electrode layer. The capping oxide layer is covered with a first layer of photoresist. The first photoresist is patterned using a photolithography process to provide a first photoresist mask for forming the first gate electrode wherein the resolution of the photolithography process provides the first photoresist mask overlying the planned first gate electrode having a first line width. The first photoresist mask and the capping oxide layer are etched wherein the capping oxide layer is etched vertically through no more than half of the capping oxide layer and wherein the first photoresist mask and the capping oxide layer are etched horizontally to provide a first oxide mask having a second line width one half the width of the first line width overlying the planned first gate electrode. Thereafter, the first photoresist mask is removed. Thereafter, the capping oxide layer is covered with a second layer of photoresist. The second photoresist layer is patterned using the photolithography process to provide a second photoresist mask for forming the second gate electrode wherein the resolution of the photolithography process provides the second photoresist mask overlying the planned second gate electrode having the first line width and wherein the second photoresist mask is shifted horizontally by twice the desired feature size from the first photoresist mask. The second photoresist mask and the capping oxide layer are etched wherein the capping oxide layer is etched vertically through no more than half of the capping oxide layer and wherein the second photoresist mask and the capping oxide layer are etched horizontally to provide a second oxide mask having a second line width one half the width of the first line width overlying the planned second gate electrode and wherein all of the capping oxide layer is removed except for the first and second oxide masks. Thereafter, the second photoresist mask is removed. The gate electrode layer is etched through where it is not covered by the first and second oxide masks to the underlying gate silicon oxide layer to form the first and second gate electrodes having the second line width of one half the resolution of the photolithography process in the manufacture of an integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
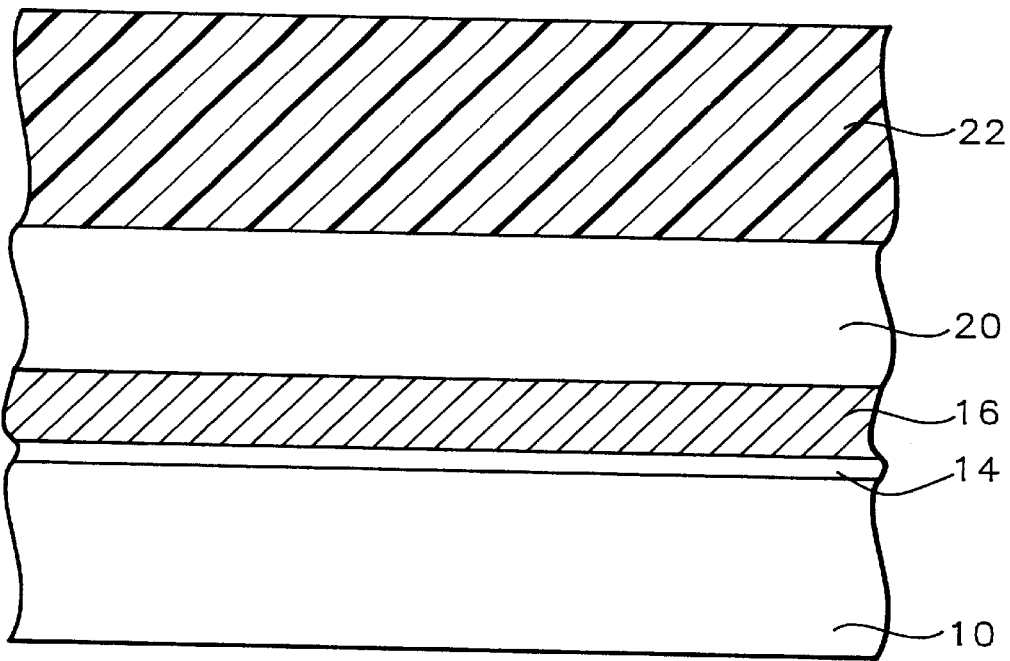
FIGS. 1 through 7 are cross-sectional representations of a preferred embodiment of the present invention.

The process of the present invention can be used in any application where small feature sizes are desired. The process can be used to form bit lines, word lines, polysilicon gate electrodes, shallow trench isolation (STI), local oxidation of silicon (LOCOS), and the like. The drawing FIGS. 1-8 illustrate the process of the invention in making a polycide gate electrode. It will be appreciated by those skilled in the art that the process of the invention can be used to make any structure where lithography and etching are used to form the structure and where small feature sizes are needed.

Referring now more particularly to FIG. 1, there is shown a semiconductor substrate 10. A gate silicon oxide layer 14 is grown on the surface of the substrate, as is conventional in the art. The gate electrode layer 16 may be a polysilicon layer or a polycide layer. For a polycide layer, typically a first layer if polysilicon layer is deposited overlying the gate oxide layer 14 by low pressure chemical vapor deposition (LPCVD) to a thickness of between about 50 and 200 Angstroms. Then a silicide layer is formed overlying the polysilicon layer. This layer may comprise tungsten silicide or titanium silicide having a thickness of between about 1500 and 3000 Angstroms. The layer 16, illustrated in FIG. 1, may be a polysilicon layer alone to form a polysilicon gate electrode or a combination of polysilicon and silicide layer to form a polycide gate electrode.

A capping layer of silicon oxide 20 is deposited overlying the polysilicon or silicide layer 16 to a thickness of between about 1000 and 3000 Angstroms.

Figure 2:
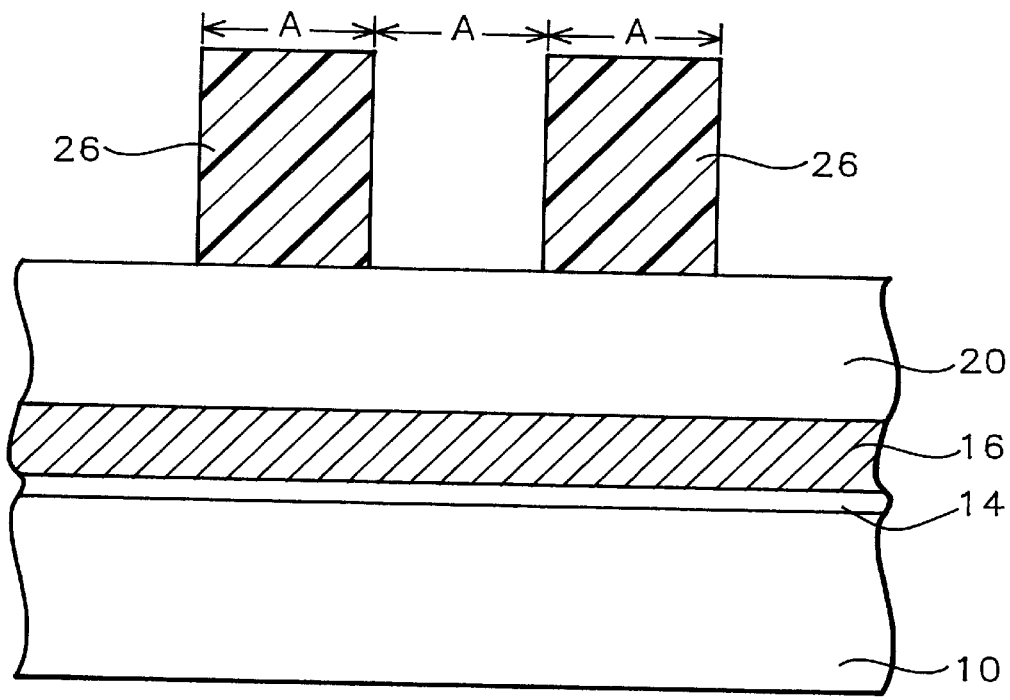

A layer of photoresist 22 is coated over the oxide layer 20. The photomask, not shown, is positioned over the wafer and the photoresist material 22 is exposed to actinic light using i-line photolithography, for example. The photoresist is developed to leave the photoresist mask 26, as shown in FIG. 2. For example, if the line width resolution of the photolithography process is 0.35 $\mu$m, a spacing A of 0.35 $\mu$m will be found in the photoresist mask openings. In the drawing figures, the spacing between the photomask portions is the same as the width of the mask portions. This is not required, but is an example only.

Figure 3:
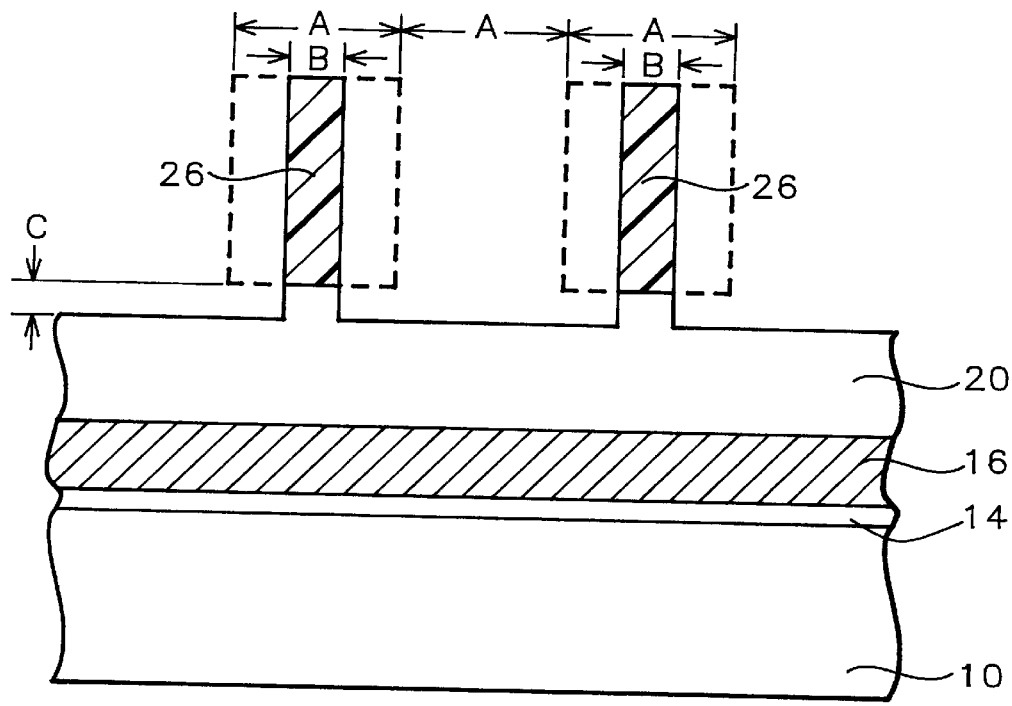

Referring now to FIG. 3, portions of the photoresist mask and the oxide layer 20 are etched away. The etching recipe, disclosed in co-pending U.S. patent application Ser. No. 08/711,142 filed on Sep. 9, 1996, incorporated herein by reference, accurately controls the consumption of the photoresist material isotropically to provide a specific oxide thickness, such as 0.18 $\mu$m or smaller, as shown by width B. The resulting oxide thickness C remaining is one half of the original thickness. The etching recipe includes the gases $CHF_3/CF_4/O_2/Ar$.

Figure 4:
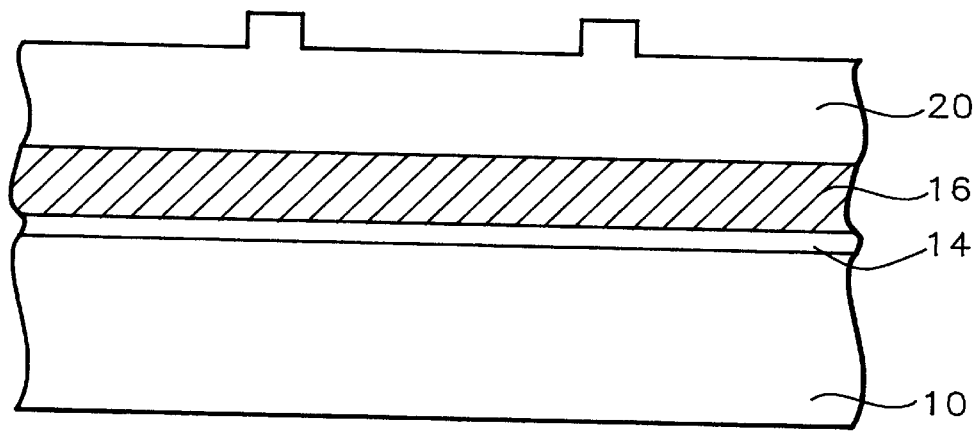
Figure 5:
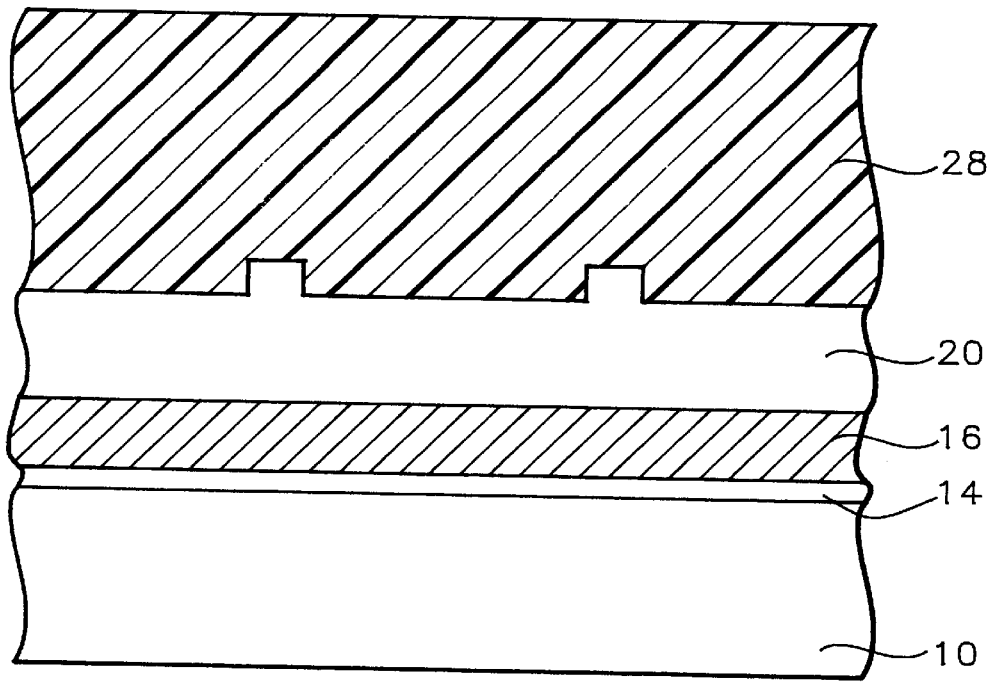

Referring now to FIG. 4, the photoresist mask 26 is removed. A second photoresist layer 28 is coated over the substrate, as illustrated in FIG. 5.

Figure 6:
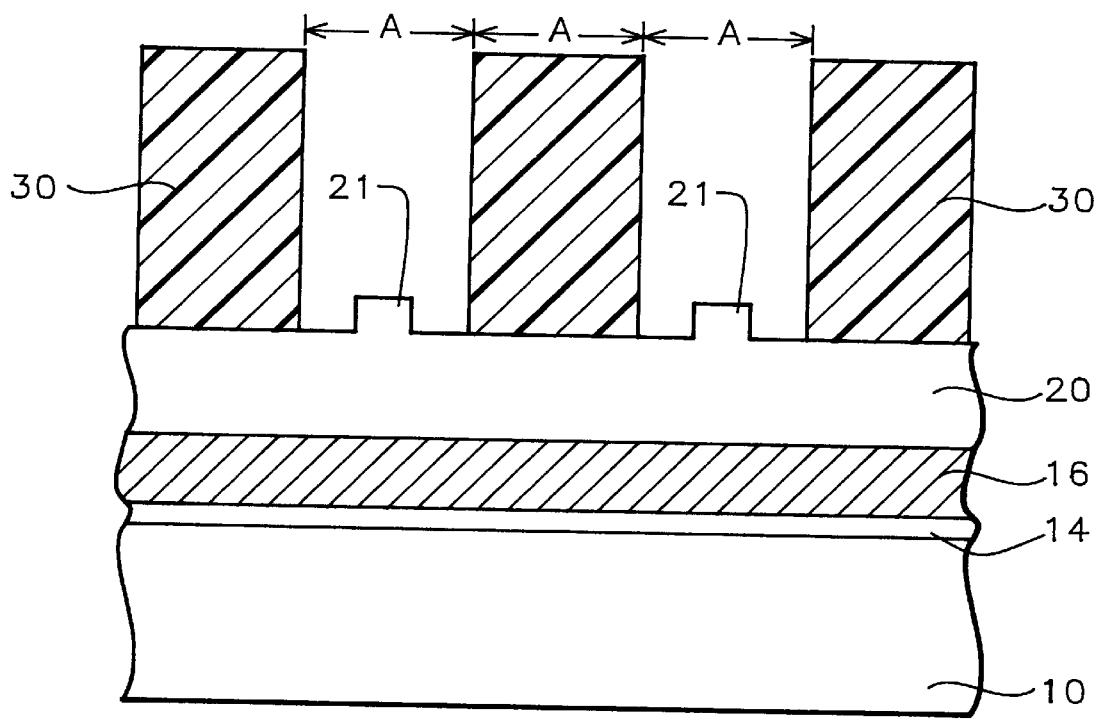

The second photoresist layer 28 is exposed to actinic light, for example, using i-line photolithography, and developed to form the second photoresist mask 30 shown in FIG. 6. This second photoresist mask may be formed in one of two ways. On the stepper, the photomask may be shifted by 0.35 $\mu$m, or twice the desired feature size.

Alternatively, a new photomask could be used where the new mask is shifted by twice the desired feature size with respect to the first photomask. This method is preferred because, in reality, chip layout is not just a repeated pattern.

The spacing A in the photoresist mask openings is the same as the spacing of the first photoresist mask 26.

Figure 7:
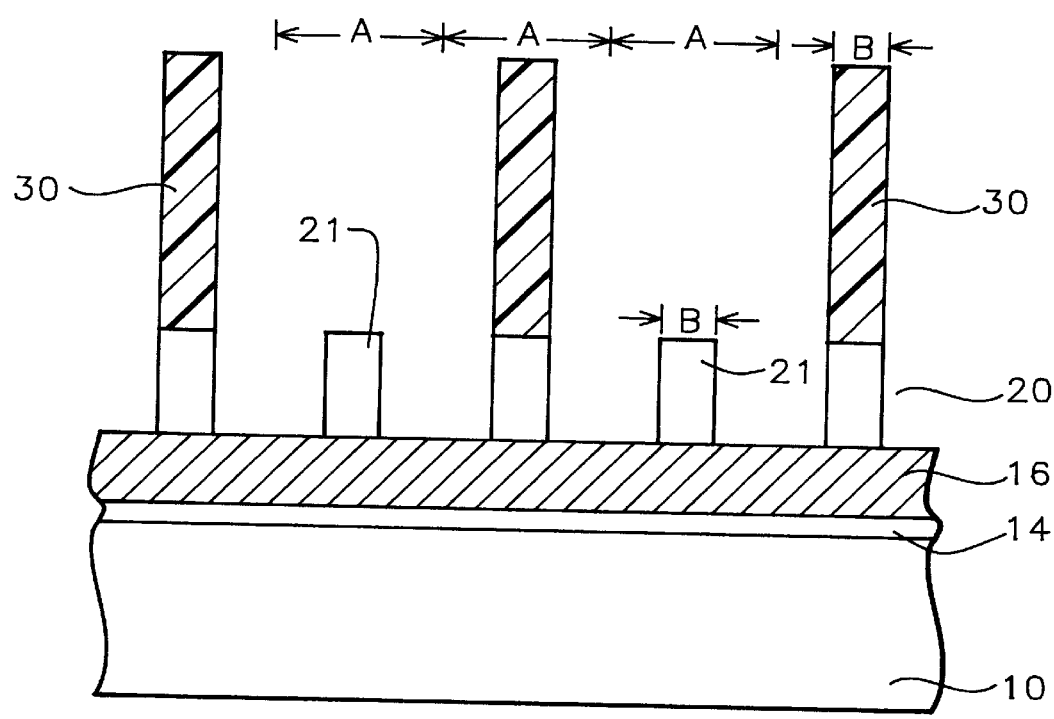

Referring now to FIG. 7, portions of the photoresist mask 30 and the oxide 20 are etched away, as above, so that the oxide is partially etched vertically and so that the oxide and photoresist are etched horizontally to achieve the desired oxide width B and leaving first oxide mesas 21.

Figure 8A:
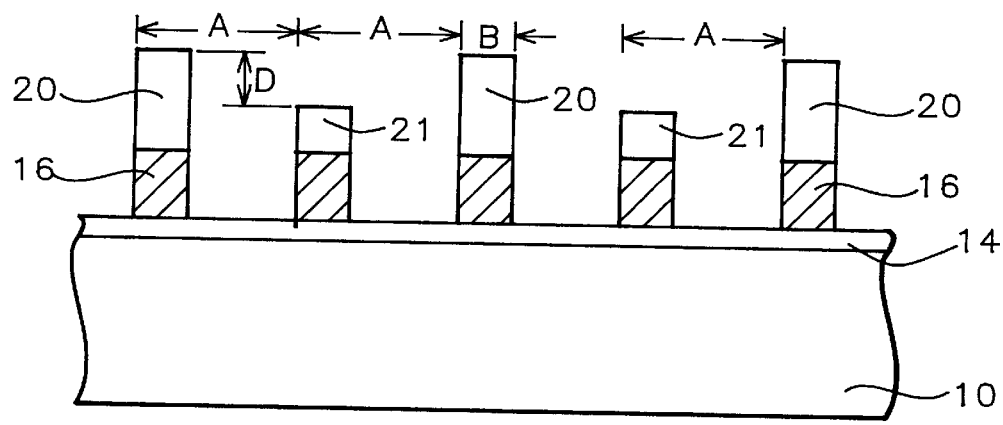
FIGS. 8A and 8B are cross-sectional representations of two alternatives in a preferred embodiment of the present invention.

Now, the polycide material is etched through using the photoresist mask 30 and the oxide 20 and oxide mesas 21 as a mask. The polycide layer 16 is etched as is conventional in the art. During this etch, a portion of the oxide D on the mesas 21 not covered by the photoresist mask is etched away; that is, approximately 200 to 400 Angstroms in thickness. This is illustrated in FIG. 8A after the removal of the photoresist mask.

Figure 8B:
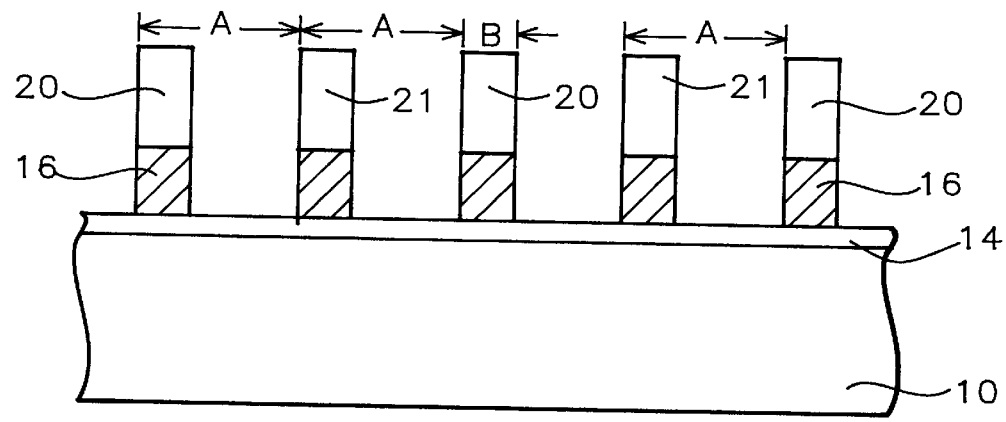

Alternatively, the photoresist mask can be removed first and the polycide material etched away using only the oxide mesas 20 and 21 as a mask. In this way, the loss of oxide thickness, of approximately 200 to 400 Angstroms, is uniform for all the mesas. This embodiment is preferred and is illustrated in FIG. 8B.

Processing continues as is conventional in the art. If, as illustrated in the drawing figures, gate electrodes have been fabricated by the process of the invention, source and drain regions may be formed, interlevel dielectric deposited and electrical contacts completed, as is conventional. If the process of the invention is used to fabricate word lines or bit lines, passivation and further metallization may be provided as desired. If shallow trench isolation regions are formed, the trenches are filled and semiconductor device structures are fabricated in the active areas between the trenches. If local oxidation of silicon regions are formed, the silicon is oxidized in the regions and semiconductor device structures are fabricated in the active areas between the isolation regions.

The present invention provides a process for lithography and etching which supports feature sizes of one half the resolution of the lithography process. The small feature sizes can be formed using i-line photolithography without using specific tools such as Electron beam (E-beam) or X-ray lithography. However, the process of making feature sizes of one half of the resolution can be extended to deep ultraviolet (DUV), E-beam, or X-ray lithography. The process of the invention can be used in any application where small feature sizes are desired.

While the invention has been particularly shown and described with reference to the preferred embodiments thereof, it will be understood by those skilled in the art that various changes in form and details may be made without departing from the spirit and scope of the invention.

What is claimed is:

1. A method of forming a first and a second feature each having a feature size of one half resolution of a photolithography process in the manufacture of an integrated circuit device comprising:

providing a feature layer on the surface of a semiconductor substrate;

depositing a capping oxide layer overlying said feature layer;

covering said capping oxide layer with a first photoresist layer;

patterning said first photoresist layer using said photolithography process to provide a first photoresist mask for forming said first feature wherein the resolution of said photolithography process provides said first photoresist mask overlying planned said first feature having a first feature size;

etching said first photoresist mask and said capping oxide layer wherein said capping oxide layer is etched vertically through no more than half of said capping oxide layer and wherein said first photoresist mask and said capping oxide layer are etched horizontally to provide a first oxide mask having a second feature size one half the width of said first feature size which is said feature size overlying said planned first feature; of a semiconductor substrate;

depositing a gate electrode layer overlying said gate silicon oxide layer;

depositing a capping oxide layer overlying said gate electrode layer;

covering said capping oxide layer with a first photoresist layer;

patterning said first photoresist layer using said photolithography process to provide a first photoresist mask for forming said first gate electrode wherein the resolution of said photolithography process provides said first photoresist mask overlying planned said first gate electrode having a first line width;

etching said first photoresist mask and said capping oxide layer wherein said capping oxide layer is etched vertically through no more than half of said capping oxide layer and wherein said first photoresist mask and said capping oxide layer are etched horizontally to provide a first oxide mask having a second line width one half the width of said first line width overlying said planned first gate electrode;

thereafter removing said first photoresist mask to expose said first oxide mask;

thereafter covering said capping oxide layer with a second photoresist layer;

patterning said second photoresist layer using said photolithography process to provide a second photoresist mask for forming said second gate electrode wherein the resolution of said photolithography process provides said second photoresist mask overlying planned said second gate electrode having said first line width and wherein said second photoresist mask is shifted horizontally by twice said line width from said first photoresist mask;

etching said second photoresist mask and said capping oxide layer wherein said capping oxide layer is etched vertically through no more than half of said capping oxide layer thickness and wherein said second photoresist mask and said capping oxide layer are etched horizontally to provide a second oxide mask having a second line width one half the width of said first line width overlying said planned second gate electrode and wherein all of said capping oxide layer is removed except for said first and second oxide masks;

thereafter removing said second photoresist mask to expose said second oxide mask; and etching through said gate electrode layer where it is not covered by said first and second oxide masks to said underlying gate silicon oxide layer to form said first and second gate electrodes having said second line thereafter removing said first photoresist mask to expose said first oxide mask;

thereafter covering said capping oxide layer with a second of photoresist layer;

patterning said second photoresist layer using said photolithography process to provide a second photoresist mask for forming said second feature wherein the resolution of said photolithography process provides said second photoresist mask overlying planned said second feature having said first feature size and wherein said second photoresist mask is shifted horizontally by twice said feature size from said first photoresist mask;

etching said second photoresist mask and said capping oxide layer wherein said capping oxide layer is etched vertically through no more than half of said capping oxide layer thickness and wherein said second photoresist mask and said capping oxide layer are etched horizontally to provide a second oxide mask having a second feature size one half the width of said first feature size which is said feature size overlying said planned second feature and wherein all of said capping oxide layer is removed except for said first and second oxide masks;

thereafter removing said second photoresist mask to expose said second oxide mask; and etching through said feature layer where it is not covered by said first and second oxide masks to form said first and second features having said second feature size which is said feature size of one half said resolution of said photolithography process in the manufacture of said integrated circuit device.

2. The method according to claim 1 wherein said first and second features to be formed are polysilicon gate electrodes.

3. The method according to claim 1 wherein said first and second features to be formed are polycide gate electrodes.

4. The method according to claim 1 wherein said first and second features to be formed are word lines.

5. The method according to claim 1 wherein said first and second features to be formed are bit lines.

6. The method according to claim 1 wherein said first and second features to be formed are shallow trench isolation trenches.

7. The method according to claim 1 wherein said first and second features to be formed are local oxidation of silicon regions.

8. The method according to claim 1 wherein said capping oxide layer has a thickness of between about 1000 and 3000 Angstroms.

9. The method according to claim 1 wherein said etching of said first and second photoresist layers and said capping oxide layer comprises $CHF_3/CF_4/O_2/Ar$ chemistry.

10. The method according to claim 1 wherein said etching of said feature layer is performed before said removing of said second photoresist mask.

11. A method of forming a first and a second gate electrode each having a line width of one half resolution of a photolithography process in the manufacture of an integrated circuit device comprising:

providing a gate silicon oxide layer on the surface width of one half said resolution of said photolithography process in the manufacture of said integrated circuit device.

12. The method according to claim 11 wherein said gate electrode layer comprises polysilicon having a thickness of between about 50 and 200 Angstroms.

13. The method according to claim 11 wherein said gate electrode layer comprises a first layer of polysilicon having a thickness of between about 50 and 200 Angstroms and a second layer of silicide having a thickness of between about 1500 and 3000 Angstroms.

14. The method according to claim 13 wherein said second layer of silicide comprises one of the group containing tungsten silicide and titanium silicide.

15. The method according to claim 11 wherein said capping oxide layer has a thickness of between about 1000 and 3000 Angstroms.

16. The method according to claim 11 wherein said etching of said first and second photoresist layers and said capping oxide layer comprises $CHF_3/CF_4/O_2/Ar$ chemistry.

17. The method according to claim 11 wherein said the etching of said gate electrode layer is performed before said removing of said second photoresist mask.

* * * * *